(12) United States Patent
Lee et al.

(10) Patent No.: US 12,159,095 B2
(45) Date of Patent: Dec. 3, 2024

(54) METHOD OF DESIGNING INTERCONNECT STRUCTURE OF SEMICONDUCTOR APPARATUS AND METHOD OF MANUFACTURING SEMICONDUCTOR APPARATUS USING THE SAME

(71) Applicant: SAMSUNG ELECTRONICS CO., LTD., Suwon-si (KR)

(72) Inventors: Joonnyung Lee, Seoul (KR); Yeongjun Kwon, Seoul (KR); Jaeyong Shin, Hwaseong-si (KR); Jeonghoon Ahn, Seongnam-si (KR); Yunki Choi, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 397 days.

(21) Appl. No.: 17/572,860

(22) Filed: Jan. 11, 2022

(65) Prior Publication Data

US 2022/0366122 A1 Nov. 17, 2022

(30) Foreign Application Priority Data

May 14, 2021 (KR) .......................... 10-2021-0062953

(51) Int. Cl.
*G06F 30/392* (2020.01)
*G06F 30/3953* (2020.01)
*H01L 23/528* (2006.01)

(52) U.S. Cl.
CPC ........ *G06F 30/3953* (2020.01); *H01L 23/528* (2013.01)

(58) Field of Classification Search
CPC .. G06F 21/79; G06F 21/86; G06F 2221/2129; G06F 30/392; G06F 30/39; G06F 30/3953; G06F 30/398; G06F 2119/18; G06F 30/00; H01L 21/823871; H01L 23/544; H01L 21/84; H01L 21/743; H01L 21/76898; H01L 21/823462; H01L 21/823475; H01L 23/535; H01L 27/0694; H01L 27/1203; H01L 2924/13091;
(Continued)

(56) References Cited

U.S. PATENT DOCUMENTS

| 5,032,890 A | 7/1991 | Ushiku et al. |
| 6,680,539 B2 | 1/2004 | Nohsoh et al. |

(Continued)

FOREIGN PATENT DOCUMENTS

| JP | 2012146845 A | 8/2012 |
| JP | 5938084 B2 | 6/2016 |

*Primary Examiner* — Binh C Tat
(74) *Attorney, Agent, or Firm* — Sughrue Mion, PLLC

(57) ABSTRACT

A method of designing an interconnect structure of a semiconductor apparatus is provided. The interconnect structure includes interconnection layers sequentially stacked on a semiconductor substrate, and each of the interconnection includes dummy metal patterns and main metal patterns. The method includes: determining a layout of the main metal patterns included in each of the plurality of interconnection layers; determining a number of interconnection layers in the plurality of interconnection layers; and determining a layout of the dummy metal patterns included in each of the plurality of interconnection layers based on the determined layout of the main metal patterns and the determined number of interconnection layers.

20 Claims, 7 Drawing Sheets

(58) Field of Classification Search
CPC ... H01L 2924/15311; H01L 21/823456; H01L 2221/6834; H01L 2224/05572; H01L 2224/0557; H01L 2224/05567; H01L 2224/16146; H01L 2224/73215; H01L 24/83; H01L 24/80; H01L 24/73; H01L 29/6681; H01L 29/42384; H01L 29/41733; H01L 29/78612
USPC .................................................. 716/126–131
See application file for complete search history.

(56) References Cited

U.S. PATENT DOCUMENTS

| | | |
|---|---|---|
| 7,023,080 B2 | 4/2006 | Ozawa et al. |
| 7,124,386 B2 | 10/2006 | Smith et al. |
| 7,152,215 B2 | 12/2006 | Smith et al. |
| 7,358,609 B2 | 4/2008 | Iguchi et al. |
| 7,363,099 B2 | 4/2008 | Smith et al. |
| 8,365,127 B2 | 1/2013 | Hirabayashi |
| 8,645,879 B2 | 2/2014 | Fang et al. |
| 9,905,576 B2 * | 2/2018 | Becker .................. G06F 30/392 |
| 2018/0130707 A1 * | 5/2018 | Clendenning ..... H01L 21/76865 |
| 2019/0164846 A1 * | 5/2019 | Leib ................ H01L 21/823842 |

* cited by examiner

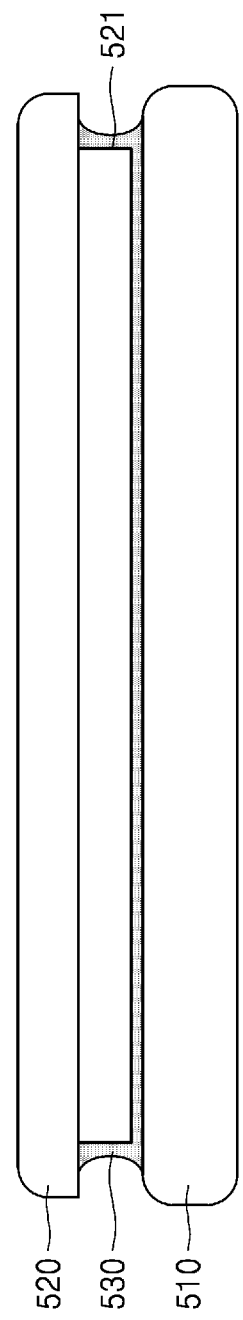

METHOD OF DESIGNING INTERCONNECT STRUCTURE OF SEMICONDUCTOR APPARATUS AND METHOD OF MANUFACTURING SEMICONDUCTOR APPARATUS USING THE SAME

CROSS-REFERENCE TO RELATED APPLICATION

This application claims priority from Korean Patent Application No. 10-2021-0062953, filed on May 14, 2021, in the Korean Intellectual Property Office, the disclosure of which is incorporated by reference herein in its entirety.

BACKGROUND

Methods, apparatuses and systems consistent with example embodiments relate to an interconnect structure of a semiconductor apparatus and a method of manufacturing a semiconductor apparatus using the same.

A plurality of semiconductor chips may be stacked on an interposer to form a semiconductor package. To manufacture semiconductor packages that include an interposer, a wafer level packaging method of manufacturing semiconductor packages by sawing a structure has been proposed. The structure may be generated by attaching a wafer with a semiconductor device formed thereon to an interposer. However, the interposer may be warped due to stress from an interconnection layer of the interposer electrically connected to a semiconductor device, and such warpage causes defects in the process of attaching a wafer to the interposer.

SUMMARY

One or more example embodiments provide a method of designing an interconnect structure of a semiconductor apparatus.

One or more example embodiments also provide a method of manufacturing a semiconductor apparatus using a designed interconnect structure of a semiconductor apparatus.

According to an aspect of an example embodiment, there is provided a method of designing an interconnect structure of a semiconductor apparatus, the interconnect structure of the semiconductor apparatus including a plurality of interconnection layers sequentially stacked on a semiconductor substrate, and each of the plurality of interconnection layers including dummy metal patterns and main metal patterns, the method including determining a layout of the main metal patterns included in each of the plurality of interconnection layers, determining a number of interconnection layers in the plurality of interconnection layers, and determining a layout of the dummy metal patterns included in each of the plurality of interconnection layers based on the determined layout of the main metal patterns and the determined number of interconnection layers.

According to an aspect of an example embodiment, there is provided a method of designing an interconnect structure of a semiconductor apparatus, the interconnect structure of the semiconductor apparatus including a plurality of interconnection layers sequentially stacked on a semiconductor substrate, each of the plurality of interconnection layers including dummy metal patterns and main metal patterns, and the main metal patterns including a first main metal pattern positioned near the dummy metal patterns to define a dummy insertion area in which the dummy metal patterns are arranged, the method including determining a layout of the main metal patterns included in each of the plurality of interconnection layers, determining a number of interconnection layers in the plurality of interconnection layers, and determining a layout of the dummy metal patterns included in each of the plurality of interconnection layers based on the determined layout of the main metal patterns and the determined number of the plurality of interconnection layers. The determining of the layout of the dummy metal patterns includes determining a local dummy pattern density of the dummy metal patterns as less than a first reference density based on a line width of the first main metal pattern having a first line width greater than a reference line width; and determining the local dummy pattern density of the dummy metal patterns as greater than the first reference density based on the line width of the first main metal pattern having a second line width less than the reference line width. The local dummy pattern density corresponds to a ratio of a planar area of the dummy metal patterns provided on a corresponding interconnection layer, to a planar area of the dummy insertion area provided on the corresponding interconnection layer.

According to an aspect of an example embodiment, there is provided a method of manufacturing a semiconductor apparatus including a semiconductor substrate and an interconnect structure on the semiconductor substrate, the interconnect structure including a plurality of interconnection layers sequentially stacked on the semiconductor substrate, and the plurality of interconnection layers each including dummy metal patterns and main metal patterns, the method including: determining a layout of the interconnect structure and forming the interconnect structure on the semiconductor substrate according to the determined layout of the interconnect structure, wherein the determining of the layout of the interconnect structure includes determining a layout of the main metal patterns included in each of the plurality of interconnection layers, determining a number of the plurality of interconnection layers, and determining a layout of the dummy metal patterns included in each of the plurality of interconnection layers based on the determined layout of the main metal patterns and the determined number of the plurality of interconnection layers.

BRIEF DESCRIPTION OF THE DRAWINGS

The above and other aspects, features, and advantages will be more clearly understood from the following description, taken in conjunction with the accompanying drawings in which:

FIG. 7 is a schematic view illustrating a state in which a wafer is attached to an interposer in a manufacturing process of a semiconductor package according to example embodiments.

DETAILED DESCRIPTION

Figure 1:
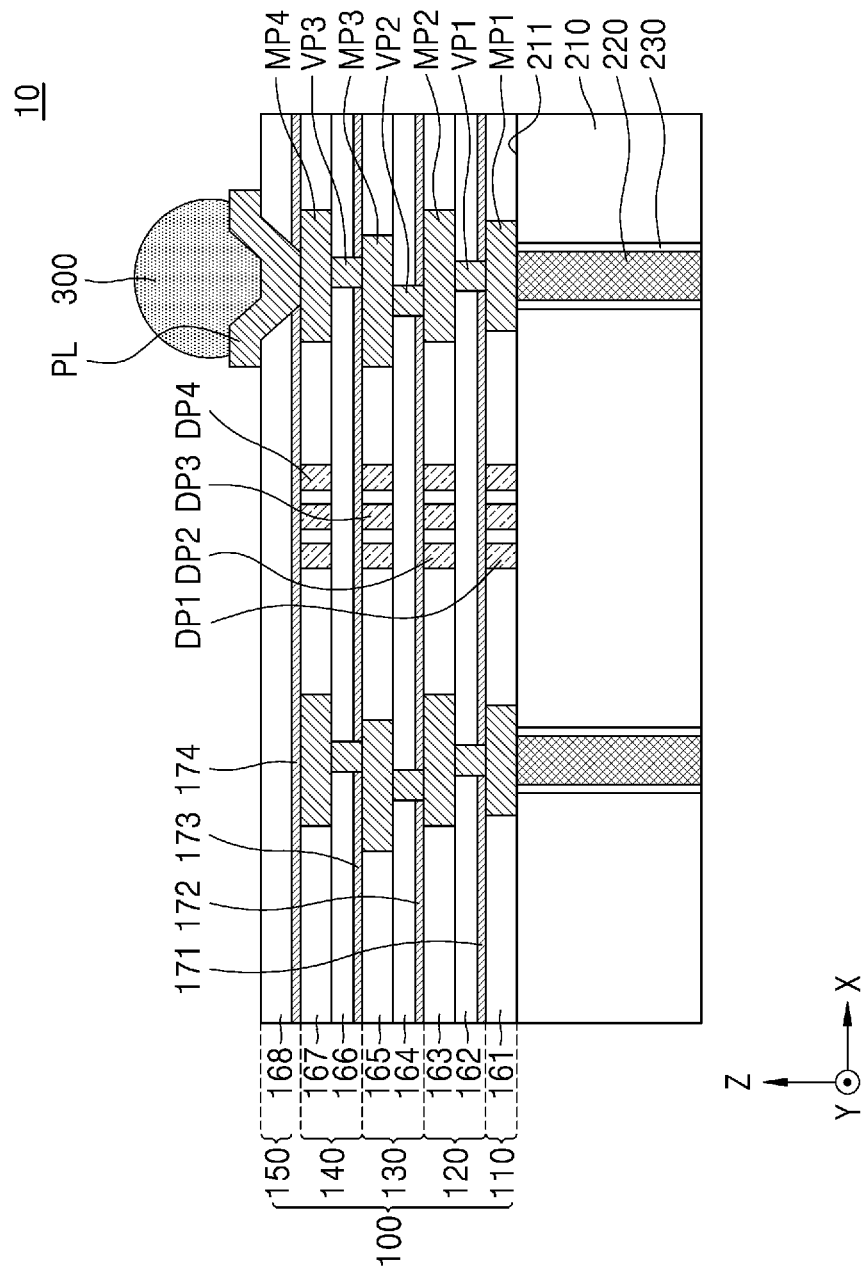
FIG. 1 is a cross-sectional view illustrating a semiconductor apparatus according to example embodiments.

Hereinafter, example embodiments will be described in detail with reference to the accompanying drawings. The same reference numerals are used for the same components in the drawings, and repeated descriptions thereof are omitted. It will be understood that when an element or layer is referred to as being "on," "connected to" or "coupled to" another element or layer, it can be directly on, connected or coupled to the other element or layer, or intervening elements or layers may be present. By contrast, when an element is referred to as being "directly on," "directly connected to" or "directly coupled to" another element or layer, there are no intervening elements or layers present. As used herein, the term "and/or" includes any and all combinations of one or more of the associated listed items. Expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c.

Figure 2:
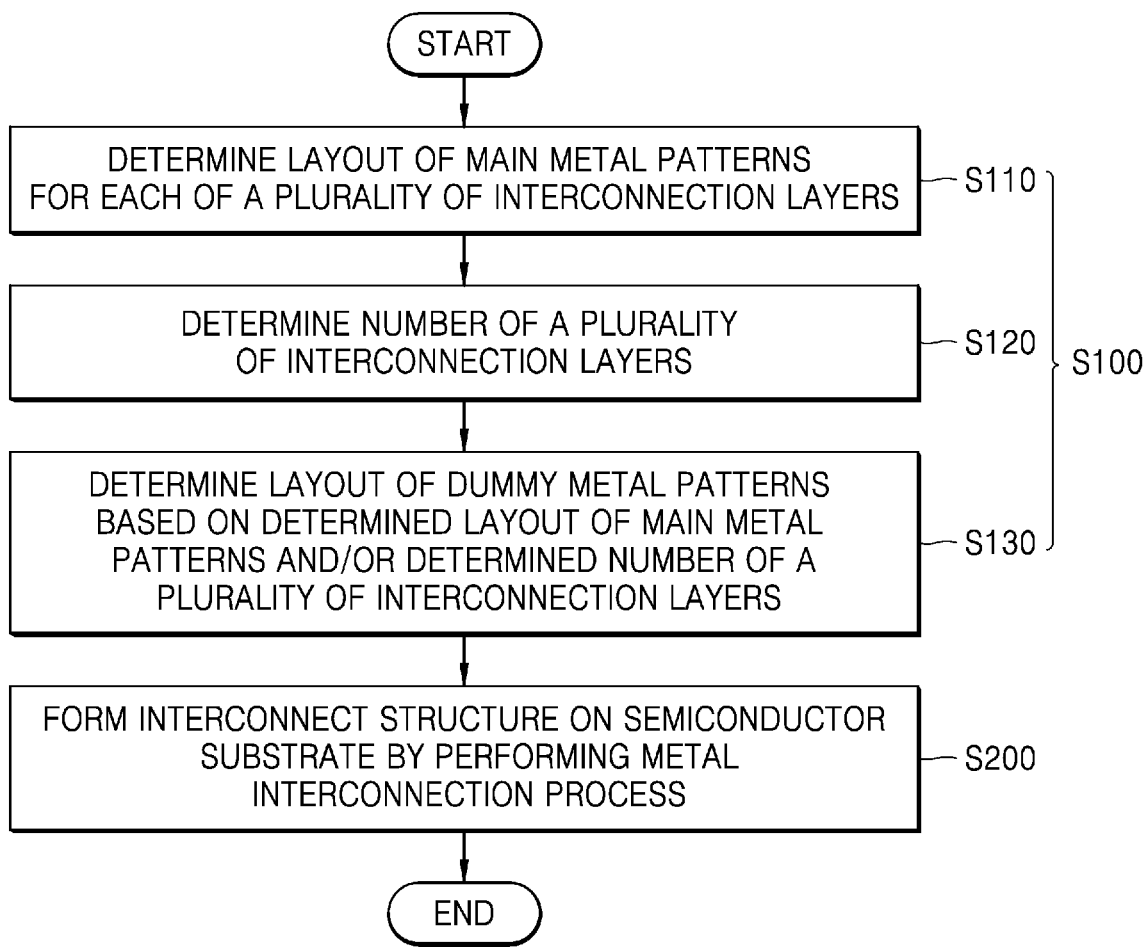
FIG. 2 is a flowchart illustrating a method of manufacturing a semiconductor apparatus according to example embodiments.

FIG. 1 is a cross-sectional view illustrating a semiconductor apparatus 10 according to example embodiments. FIG. 2 is a flowchart illustrating a method of manufacturing the semiconductor apparatus 10 according to example embodiments.

Referring to FIGS. 1 and 2, the method of manufacturing the semiconductor apparatus 10 may include designing a layout of an interconnect structure 100 of the semiconductor apparatus 10 (S100) and performing a metal interconnection process based on the layout of the interconnect structure 100 designed in operation S100 to form the interconnect structure 100 on a semiconductor substrate 210 (S200).

The semiconductor apparatus 10 is an apparatus that includes the interconnect structure 100, and may be, for example, an interposer, a semiconductor package, a component constituting a portion of the semiconductor package, a semiconductor chip, or a component constituting a portion of the semiconductor chip.

In FIG. 1, a case in which the semiconductor apparatus 10 is an interposer is described. For example, the interposer may be mounted on a package substrate such as a printed circuit board, and a plurality of semiconductor chips may be mounted on the interposer. The interposer may provide an electrical connection path between the semiconductor chips mounted thereon and/or an electrical connection path between each of the semiconductor chips and the package substrate.

The semiconductor apparatus 10 may include the semiconductor substrate 210, a through-electrode 220 penetrating through the semiconductor substrate 210, and the interconnect structure 100 on the semiconductor substrate 210.

The semiconductor substrate 210 may be a semiconductor wafer. The semiconductor substrate 210 may include, for example, silicon (Si). Alternatively, the semiconductor substrate 210 may include a semiconductor element such as germanium (Ge) or a compound semiconductor such as silicon carbide (SiC), gallium arsenide (GaAs), indium arsenide (InAs), and indium phosphide (InP).

The semiconductor substrate 210 may include a main surface 211 on which the interconnect structure 100 is stacked. The main surface 211 of the semiconductor substrate 210 may be an active surface. Hereinafter, a direction parallel to the main surface 211 of the semiconductor substrate 210 is referred to as a horizontal direction (e.g., an X-direction and/or a Y-direction), and a direction perpendicular to the main surface 211 of the semiconductor substrate 210 is referred to as a vertical direction (e.g., a Z-direction). Also, a planar area of a certain component is referred to as an area of the certain component on a certain plane parallel to the main surface 211 of the semiconductor substrate 210.

The through-electrode 220 may be in a via hole extending from the main surface 211 of the semiconductor substrate 210. A via insulating layer 230 may be between the through-electrode 220 and the semiconductor substrate 210. For example, the through-electrode 220 may include a buried conductive layer and a barrier conductive layer surrounding a sidewall of the buried conductive layer and between the buried conductive layer and the via insulating layer 230.

The interconnect structure 100 may include a plurality of interconnection layers stacked on the main surface 211 of the semiconductor substrate 210 in a vertical direction (e.g., the Z-direction). Each of the interconnection layers may include a main metal layer, a dummy metal layer, and an insulating layer surrounding the main metal layer and the dummy metal layer. The main metal layers included in the interconnection layers may be positioned on different vertical levels to constitute a multilayer metal interconnect structure. Here, the main metal layer included in one interconnection layer may constitute one layer. The main metal layer may be an electrical connection path extending in a horizontal direction (e.g., the X-direction and/or the Y-direction) on the same vertical level. Each of the plurality of interconnection layers may be formed through, for example, a damascene process.

In example embodiments, the interconnect structure 100 may include a first interconnection layer 110, a second interconnection layer 120, a third interconnection layer 130, a fourth interconnection layer 140, and a pad layer 150.

The first interconnection layer 110 may include a first main metal layer MP1, a first dummy metal layer DP1, and a first insulating layer 161 covering the first main metal layer MP1 and the first dummy metal layer DP1. The first dummy metal layer DP1 may be physically and electrically separated from the first main metal layer MP1. The first dummy metal layer DP1 may be formed through the same metal interconnection process as that of the first main metal layer MP1, and may be on substantially the same vertical level.

The second interconnection layer 120 may include a second main metal layer MP2, a first metal via layer VP1, a second dummy metal layer DP2, a second insulating layer 162 covering the first metal via layer VP1, and a third insulating layer 163 covering the second main metal layer MP2 and the second dummy metal layer DP2. The second dummy metal layer DP2 may be physically and electrically separated from the second main metal layer MP2. The first metal via layer VP1 may electrically connect the first main metal layer MP1 to the second main metal layer MP2 positioned on different vertical levels. The second dummy metal layer DP2 may be formed through the same metal interconnection process as that of the second main metal layer MP2 and may be on substantially the same vertical level as that of the second main metal layer MP2.

The third interconnection layer 130 may include a third main metal layer MP3, a second metal via layer VP2, a third dummy metal layer DP3, a fourth insulating layer 164 covering the second metal via layer VP2, and a fifth insulating layer 165 covering the third main metal layer MP3 and the third dummy metal layer DP3. The third dummy metal layer DP3 may be physically and electrically separated from the third main metal layer MP3. The second metal via layer VP2 may electrically connect the third main metal layer MP3 to the second main metal layer MP2 positioned on different vertical levels. The third dummy metal layer DP3 may be formed through the same metal interconnection process as that of the third main metal layer MP3 and may be on substantially the same vertical level as that of the third main metal layer MP3.

The fourth interconnection layer 140 may include a fourth main metal layer MP4, a third metal via layer VP3, a fourth dummy metal layer DP4, a sixth insulating layer 166 covering the third metal via layer VP3, and a seventh insulating layer 167 covering the fourth main metal layer MP4 and the fourth dummy metal layer DP4. The fourth dummy metal layer DP4 may be physically and electrically separated from the fourth main metal layer MP4. The third metal via layer VP3 may electrically connect the fourth main metal layer MP4 to the third main metal layer MP3 positioned on different vertical levels. The fourth dummy metal layer DP4 may be formed through the same metal interconnection process as that of the fourth main metal layer MP4, and may be on substantially the same vertical level as that of the fourth main metal layer MP4.

The pad layer 150 may include a pad metal layer PL and an eighth insulating layer 168. An opening may be formed through the eighth insulating layer 168. The pad metal layer PL may be connected to the fourth main metal layer MP4 through the opening of the eighth insulating layer 168. The pad metal layer PL may be formed to cover a sidewall of the eighth insulating layer 168 defining the opening of the eighth insulating layer 168, a surface of the fourth main metal layer MP4 exposed through the opening of the eighth insulating layer 168, and a portion of an upper surface of the eighth insulating layer 168. The pad metal layer PL may be a pad to which a connection terminal 300 is attached. For example, the connection terminal 300 may be between a semiconductor chip mounted on the semiconductor apparatus 10, and the pad metal layer PL may electrically connect the semiconductor chip to the pad metal layer PL. For example, the connection terminal 300 may include a solder ball, a solder bump, or the like.

In example embodiments, the first to eighth insulating layers 161, 162, 163, 164, 165, 166, 167, and 168 may be formed using at least one of silicon oxide, silicon oxynitride, and SiOC. For example, the first to eighth insulating layers 161, 162, 163, 164, 165, 166, 167, and 168 may include at least one of tetraethyl orthosilicate (TEOS), tonen silazane (TOSZ), ALD oxide, flowable chemical vapor deposition (FCVD) oxide, high density plasma (HDP) oxide, and plasma enhanced oxidation (PEOX) oxide.

In example embodiments, first to fourth main metal layers MP1, MP2, MP3, and MP4, first to third metal via layers VP1, VP2, and VP3, first to fourth dummy metal layers DP1, DP2, DP3, and DP4, and the pad metal layer PL may include a metal such as copper (Cu), aluminum (Al), tungsten (W), titanium (Ti), tantalum (Ta), indium (In), molybdenum (Mo), manganese (Mn), cobalt (Co), tin (Sn), nickel (Ni), magnesium (Mg), rhenium (Re), beryllium (Be), gallium (Ga), ruthenium (Ru), or alloys thereof.

The second interconnection layer 120 may include a first etch stop layer 171 between the first interconnection layer 110 and the second insulating layer 162. The first etch stop layer 171 may cover an upper surface of the first insulating layer 161, and the second insulating layer 162 and the first etch stop layer 171 may surround a sidewall of the first metal via layer VP1. The third interconnection layer 130 may include a second etch stop layer 172 between third insulating layer 163 and the fourth insulating layer 164. The second etch stop layer 172 may cover an upper surface of the third insulating layer 163, and the second etch stop layer 172 and the fourth insulating layer 164 may surround a sidewall of the second metal via layer VP2. The fourth interconnection layer 140 may include a third etch stop layer 173 between the fifth insulating layer 165 and the sixth insulating layer 166. The third etch stop layer 173 may cover an upper surface of the fifth insulating layer 165, and the third etch stop layer 173 and the sixth insulating layer 166 may surround a sidewall of the third metal via layer VP3. The pad layer 150 may include a fourth etch stop layer 174 between the seventh insulating layer 167 and the eighth insulating layer 168. The fourth etch stop layer 174 may cover an upper surface of the seventh insulating layer 167, and the fourth etch stop layer 174 and the eighth insulating layer 168 may surround the pad metal layer PL.

The main metal layer (e.g., the first to fourth main metal layers MP1, MP2, MP3, and MP4) included in the interconnect structure 100 may refer to a metal layer to which an electrical signal, voltage, and/or current is applied. For example, when the semiconductor apparatus 10 is an interposer, the main metal layer included in the interconnect structure 100 may be used as an electrical signal transmission path between semiconductor chips mounted on the interposer, and as an electrical signal transmission path between at least one semiconductor chip mounted on the interposer and a package substrate such as a printed circuit board. In example embodiments, the main metal layer included in the interconnect structure 100 may be electrically connected to the through-electrode 220 and/or the connection terminal 300.

The dummy metal layer (e.g., the first to fourth dummy metal layers DP1, DP2, DP3, and DP4) included in the interconnect structure 100 may refer to a metal layer to which an electrical signal, voltage, and/or current is not applied. For example, the dummy metal layer may be included in the interconnect structure 100 to adjust a total metal density and/or a total amount of metal in the interconnect structure 100.

In FIG. 1, it is illustrated that the interconnect structure 100 includes a four-layer metal interconnect structure constituted by four interconnection layers. That is, it is illustrated that the interconnect structure 100 includes the first to fourth interconnection layers 110, 120, 130, and 140 sequentially stacked in a vertical direction (e.g., the Z-direction) on the main surface 211 of the semiconductor substrate 210, and includes a four-layer metal interconnect structure including the first to fourth main metal layers MP1, MP2, MP3, and MP4. In other example embodiments, the interconnect structure 100 may include two interconnection layers, three interconnection layers, or five or more interconnection layers. For example, the interconnect structure 100 may have a metal interconnect structure including two layers, a metal interconnect structure including three layers, or a metal interconnect structure including five or more layers.

A metal material included in the interconnect structure 100 generally has tensile stress, and the tensile stress of the metal material has a property of being offset by compressive stress of the insulating material included in the interconnect structure 100. By appropriately adjusting the layout of the dummy metal layer included in the interconnect structure 100, warpage occurring due to a difference in coefficients of thermal expansion between components in the semiconductor apparatus 10 may be controlled.

Referring back to FIG. 2, designing of a layout of the interconnect structure 100 of the semiconductor apparatus 10 (S100) may include determining a layout of the main metal patterns included in the interconnection layers of the interconnect structure 100 (S110), determining the number of interconnection layers included in the interconnect structure 100 (S120), and determining a layout of dummy metal patterns based on the determined layout of the main metal patterns and/or the determined number of interconnection layers (S130). FIG. 2 illustrates that operation S120 is performed after operation S110 is performed, but conversely, operation S110 may be performed after operation S120 is performed.

Figure 3:
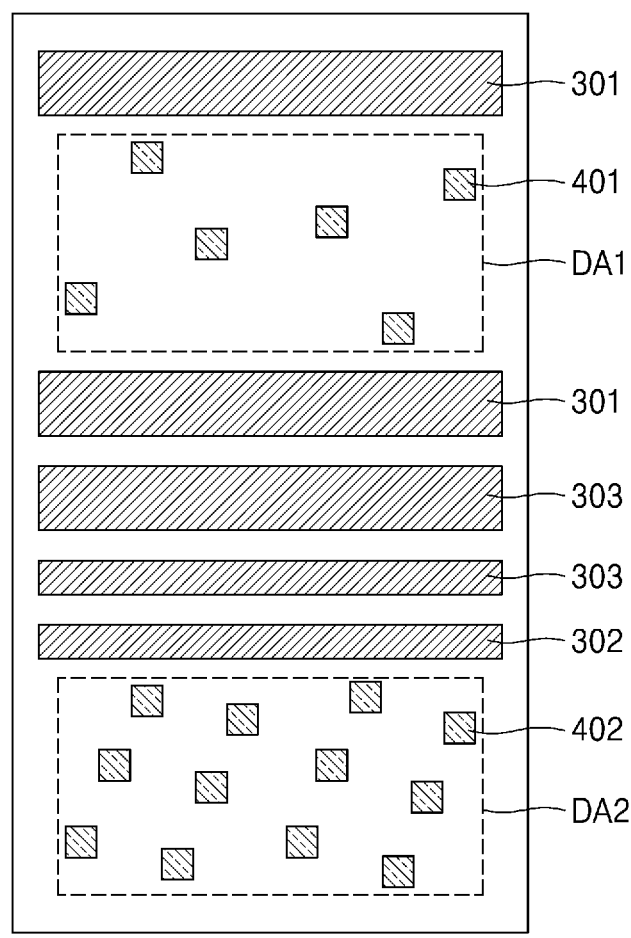
FIG. 3 is a plan view schematically illustrating an interconnection layer included in an interconnect structure of a semiconductor apparatus according to example embodiments.

FIG. 3 is a plan view schematically illustrating an interconnection layer 101 included in an interconnect structure of a semiconductor apparatus according to example embodiments.

The interconnection layer 101 illustrated in FIG. 3 may correspond to any one of the first to fourth interconnection layers 110, 120, 130, and 140 of the interconnect structure 100 illustrated in FIG. 1. The interconnection layer 101 may include first main metal patterns 301, a second main metal pattern 302, third main metal patterns 303, first dummy metal patterns 401, and second dummy metal patterns 402. The first main metal patterns 301, the second main metal pattern 302, and the third main metal patterns 303 may be on the same vertical level to form a single layer. The first main metal patterns 301, the second main metal pattern 302, and the third main metal patterns 303 may form the entirety or a portion of any one of the first to fourth main metal layers MP1, MP2, MP3, and MP4 of FIG. 1. The first dummy metal patterns 401 and the second dummy metal patterns 402 may be on the same vertical level to form a single layer. The first dummy metal patterns 401 and the second dummy metal patterns 402 may constitute the entirety or a portion of any one of the first to fourth dummy metal layers DP1, DP2, DP3, and DP4 of FIG. 1.

The first main metal patterns 301 may be near (or around) the first dummy metal patterns 401 to define a first dummy insertion area DA1 in which the first dummy metal patterns 401 are positioned. For example, the first dummy insertion area DA1 may be a rectangular region including the first dummy metal patterns 401, between the first main metal patterns 301 in a plan view, and may refer to a rectangular region having a minimum rectangular area including all of the first dummy metal patterns 401. The second main metal pattern 302 may be near the second dummy metal patterns 402 to define a second dummy insertion area DA2 in which the second dummy metal patterns 402 are positioned. For example, the second dummy insertion area DA2 may be a rectangular region including the second dummy metal patterns 402 between the second main metal pattern 302 and an edge of the interconnection layer 101 in a plan view and may refer to a rectangular region having a minimum rectangular area including all of the second dummy metal patterns 402.

Referring to FIGS. 2 and 3, the determining of the layout of the main metal patterns included in the interconnection layers of the interconnect structure (S110) may include determining a pattern density of the main metal patterns. Here, the pattern density of the main metal patterns may be defined as a ratio of a planar area of all the main metal patterns included in the interconnection layer 101 to a planar area of the interconnection layer 101 (or a planar area of the interconnect structure). For example, in the interconnection layer 101 of FIG. 3, the pattern density of the main metal patterns may refer to a value obtained by dividing the sum of the planar area of the first main metal patterns 301, the planar area of the second main metal pattern 302, and the planar area of the third main metal patterns 303 by the planar area of the interconnection layer 101.

Also, the determining of the layout of the main metal patterns included in the interconnection layers of the interconnect structure (S110) may include determining a line width of each of the main metal patterns.

In the determining of the number of interconnection layers included in the interconnect structure (S120), the number of interconnection layers may refer to the number of interconnection layers included in the interconnect structure or the number of layers of a multilayer metal interconnect structure formed by the main metal layers included in the interconnect structure. For example, because the interconnect structure 100 of the semiconductor apparatus 10 of FIG. 1 includes four interconnection layers, the number of interconnection layers included in the interconnect structure 100 is determined as 4.

The determining of the layout of the dummy metal patterns based on the determined layout of the main metal patterns and the determined number of interconnection layers (S130) may include determining a dummy pattern density of the dummy metal patterns. Here, the dummy pattern density of the dummy metal patterns may be defined as a ratio of the planar area of all the dummy metal patterns included in the interconnection layer 101 to the planar area of the interconnection layer 101 (or the planar area of the interconnect structure). For example, in the interconnection layer 101 shown in FIG. 3, the dummy pattern density may refer to a value obtained by dividing the sum of the planar area of the first dummy metal patterns 401 and the planar area of the second dummy metal patterns 402 by the planar area of the interconnection layer 101.

In example embodiments, in operation S130, the layout of the dummy metal patterns may be determined such that the sum of the pattern density of the main metal patterns determined in operation S110 and the dummy pattern density of the dummy metal patterns is within a certain reference range. In example embodiments, the sum of the pattern density of the main metal patterns and the dummy pattern density of the dummy metal patterns may be between about 20% and about 50%, between about 25% and about 45%, or between about 30% and about 40%. For example, in the interconnection layer 101 shown in FIG. 3, when the sum of the planar area of the first to third main metal patterns 301, 302, and 303 and the planar area of the first and second dummy metal patterns 401 and 402 is defined as a total metal planar area, a ratio of the total metal planar area to the planar area of the interconnection layer 101 may be between about 20% and about 50%, between about 25% and about 45%, or between about 30% and about 40%.

In example embodiments, operation S130 may include determining the number of dummy metal patterns so that the dummy metal patterns are positioned at the determined dummy pattern density. For example, in the interconnection layer 101 illustrated in FIG. 3, the number of first dummy metal patterns 401 and/or the number of second dummy metal patterns 402 may be increased to increase the dummy pattern density, or alternatively, the number of first dummy metal patterns 401 and/or the number of second dummy metal patterns 402 may be reduced to lower the dummy pattern density.

In example embodiments, operation S130 may include determining a dimension (e.g., a horizontal width in X-direction and/or a horizontal width in Y-direction) of each of the dummy metal patterns so that the dummy metal patterns may be positioned at the determined dummy pattern density. For example, in the interconnection layer 101 shown in FIG. 3, a width of the first dummy metal pattern 401 and/or a width of the second dummy metal pattern 402 may be increased to increase the dummy pattern density, or alternatively, the width of the first dummy metal pattern 401 and/or the width of the second dummy metal pattern 402 may be reduced to lower the dummy pattern density.

In example embodiments, operation S130 may include adjusting an average distance between the dummy metal patterns.

In example embodiments, operation S130 may include adjusting a local dummy pattern density of the dummy metal patterns in the dummy insertion area according to a line width of the main metal pattern provided adjacent (e.g., defining) the dummy insertion area. Here, the local dummy pattern density may be defined as a ratio of a planar area of the dummy metal patterns in the dummy insertion area to a planar area of the dummy insertion area. The local dummy pattern density may be different from the dummy pattern density in that the former refers to a ratio of the planar area of the dummy metal patterns within a local region of the interconnection layer to the planar area of the local region, and the latter refers to a ratio of the planar area of the dummy metal patterns to the planar area of the entire region of the interconnection layer. For example, in the interconnection layer 101 illustrated in FIG. 3, a first local dummy pattern density of the first dummy metal patterns 401 in the first dummy insertion area DA1 may be defined as a ratio of the planar area of the first dummy metal patterns 401 in the first dummy insertion area DA1 to the planar area of the first dummy insertion area DA1.

In example embodiments, when a line width of the main metal pattern defining the dummy insertion area is greater than a certain reference line width (e.g., 1 micrometer), the local dummy pattern density may be adjusted to have (e.g., determined as) a value less than the certain first reference density. In example embodiments, when a line width of the main metal pattern defining the dummy insertion area is less than the certain reference line width, the local dummy pattern density may be adjusted to have a value greater than the certain first reference density. For example, the first reference density may be a value selected from 0.1 to 0.9. For example, the first reference density may be 0.5. For example, when the reference line width of the main metal pattern is determined to be 1 micrometer, the first reference density may be 0.5. Adjusting the local dummy pattern density of the dummy metal patterns in the dummy insertion area is described in detail with reference to FIG. 4.

In example embodiments, operation S130 may include adjusting a pattern density of the dummy metal patterns according to the number of interconnection layers. For example, when the main metal patterns of the interconnection layer have a certain layout and the interconnect structure includes interconnection layers stacked by a certain reference number of layers, the dummy pattern density may be set to have a second reference density. In this case, if the number of interconnection layers is less than the reference number of layers, the dummy pattern density may be adjusted to have a value greater than the second reference density. In addition, if the number of interconnection layers is greater than the reference number of layers, the dummy pattern density may be adjusted to have a value less than the second reference density. For example, the reference number of layers may be a value selected from 2 to 10. For example, the reference number of layers may be 5. For example, the second reference density may be a value selected from 0.1 to 0.9. For example, the second reference density may be 0.5. For example, when the number of reference layers is determined to be 5, the second reference density of the dummy pattern density may be 0.5. Adjusting the dummy pattern density according to the number of interconnection layers is described in detail with reference to FIGS. 5 and 6.

In example embodiments, in operation S130, the dummy pattern density of the dummy metal patterns may be determined based on both the determined layout of the main metal patterns and the determined number of interconnection layers. In example embodiments, the local dummy pattern density of the dummy metal patterns in the dummy insertion area may be determined based on the line width of the main metal pattern defining the dummy insertion area and the number of interconnection layers. The local dummy pattern density may decrease as the line width of the main metal pattern defining the dummy insertion area increases, and may decrease as the number of interconnection layers increases. In example embodiments, the local dummy pattern density may be determined using Equation (1) below. In Equation (1) below, C1 is a constant, C2 is a constant, and C3 is a constant.

$$\text{Local dummy pattern density} = C1/(\text{line width of main metal pattern}) + C2/(\text{number of multiple interconnection layers}) + C3 \quad \text{Equation (1)}$$

Figure 4:
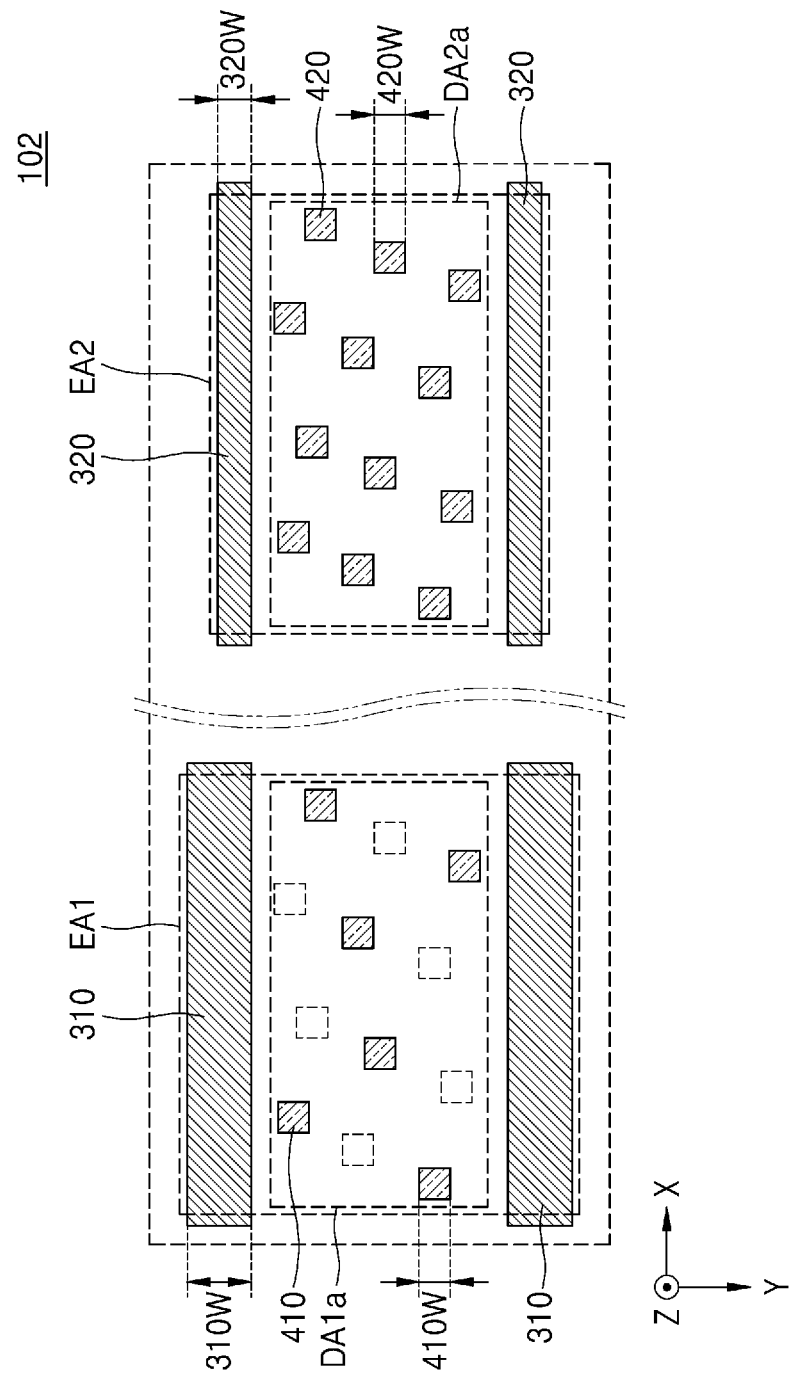
FIG. 4 is a plan view schematically illustrating an interconnection layer included in an interconnect structure of a semiconductor apparatus according to example embodiments.

FIG. 4 is a plan view schematically illustrating an interconnection layer 102 included in an interconnect structure of a semiconductor apparatus according to example embodiments.

The interconnection layer 102 illustrated in FIG. 4 may correspond to any one of the first to fourth interconnection layers 110, 120, 130, and 140 of the interconnect structure 100 illustrated in FIG. 1. The interconnection layer 102 may include first main metal patterns 310, second main metal patterns 320, first dummy metal patterns 410, and second dummy metal patterns 420.

The first main metal patterns 310 may be near the first dummy metal patterns 410 to define a first dummy insertion area DA1a in which the first dummy metal patterns 410 are positioned. The first main metal pattern 310 may have a first line width 310W. The second main metal pattern 320 may be near the second dummy metal patterns 420 to define a second dummy insertion area DA2a in which the second dummy metal patterns 420 are positioned. The second main metal pattern 320 may have a second line width 320W that is less than the first line width 310W.

Hereinafter, a method of determining a layout of the dummy metal patterns based on a layout of the main metal patterns is described with reference to FIGS. 1, 2, and 4.

In operation S130, a local dummy pattern density of the dummy metal pattern in the dummy insertion area may be adjusted according to a line width of a nearby main metal pattern defining the corresponding dummy insertion area. The local dummy pattern density of the dummy metal pattern may decrease as the line width of the nearby main metal pattern increases, and may increase as the line width of the nearby main metal pattern decreases.

In the interconnection layer 102 of FIG. 4, the first line width 310W of the first main metal patterns 310 defining the first dummy insertion area DA1a and the second line width 320W of the main metal patterns 320 defining the second dummy insertion area DA2a are different, and thus, a first local dummy pattern density of the first dummy metal pattern 410 and a second local dummy pattern density of the second dummy metal pattern 420 may be determined to be different. Because the first line width 310W of the first main metal pattern 310 is greater than the second line width 320W of the second main metal pattern 320, the first local dummy pattern density may be determined to be less than the second local dummy pattern density.

For example, when the line width of the main metal pattern defining the dummy insertion area has a certain reference line width, the local dummy pattern density of the dummy metal patterns in the corresponding dummy insertion area may be set to have a first reference density. Here, the local dummy pattern density of the dummy metal pattern in the dummy insertion area may be adjusted based on a relationship between the line width of the main metal pattern defining the corresponding dummy insertion area and the reference line width. If, in the interconnection layer 102 of FIG. 4, the first line width 310W of the first main metal pattern 310 is greater than the reference line width, the first local dummy pattern density of the first dummy metal patterns 410 may be adjusted to be less than the first reference density. If, in the interconnection layer 102 of FIG. 4, the second line width 320W of the second main metal pattern 320 is less than the reference line width, the second local dummy pattern density of the second dummy metal patterns 420 may be adjusted to be greater than the first reference density.

In example embodiments, a magnitude of an increase/decrease ratio between the line width of the main metal pattern defining the dummy insertion area and the reference line width may be the same as or similar to a magnitude of an increase/decrease ratio between the local dummy pattern density of the dummy metal pattern in the corresponding dummy insertion area and the first reference density. For example, if the first line width 310W of the first main metal pattern 310 is greater than the reference line width by 20% of the reference line width, the determined first local dummy pattern density may be smaller than the first reference density by 20% of the first reference density. For example, if the first line width 310W of the first main metal pattern 310 may be smaller than the reference line width by 20% of the reference line width, the determined first local dummy pattern density is greater than the first reference density by 20% of the first reference density.

In operation S130, the number of first dummy metal patterns 410, the number of second dummy metal patterns 420, an average distance between the first dummy metal patterns 410, and/or an average distance between the second dummy metal patterns 420 may be adjusted such that the first local dummy pattern density is adjusted to be less than the second local dummy pattern density.

For example, when a planar area of the first dummy insertion area DA1a is equal to a planar area of the second dummy insertion area DA2a, the number of first dummy metal patterns 410 may be less than the number of second dummy metal patterns 420 so that the first local dummy pattern density is less than the second local dummy pattern density.

Alternatively, when the number of first dummy metal patterns 410 is equal to the number of second dummy metal patterns 420 unlike the case of FIG. 4, the width 410W of the first dummy metal pattern 410 may be adjusted to be less than the width 420W of the second dummy metal pattern 420 so that the first local dummy pattern density is less than the second local dummy pattern density.

For example, a region including the first dummy insertion area DA1a and a portion of the first main metal patterns 310 that defines the first dummy insertion area DA1a (e.g., a portion of the first metal patterns 310 that overlaps the first dummy insertion area DA1a along the Y-direction) may be defined as a first expansion region EA1, and a region including the second dummy insertion area DA2a and a portion of the second main metal patterns 320 that defines the second dummy insertion area DA2a (e.g., a portion of the second metal patterns 320 that overlaps the second dummy insertion area DA2a along the Y-direction) may be defined as a second expansion region EA2. In this case, a value obtained by dividing the sum of a planar area of the portion of the first main metal patterns 310 and a planar area of the first dummy metal patterns 410 in the first expansion region EA1 by a total planar area of the first expansion region EA1 may be defined as a first local pattern density, and a value obtained by dividing the sum of a planar area of the portion of the second main metal patterns 320 and a planar area of the second dummy metal patterns 420 in the second expansion region EA2 by a total planar area of the second expansion region EA2 may be defined as a second local pattern density. Here, the layout of the first dummy metal patterns 410 and the layout of the second dummy metal patterns 420 may be determined such that the first local pattern density is equal to the second local pattern density or a difference between the first local pattern density and the second local pattern density is within an allowable range. In this case, the metal density for each local region of the interconnection layer 102 is substantially uniform, and thus, local warpage of each region of the semiconductor apparatus may be controlled to a substantially similar level.

Figure 5:
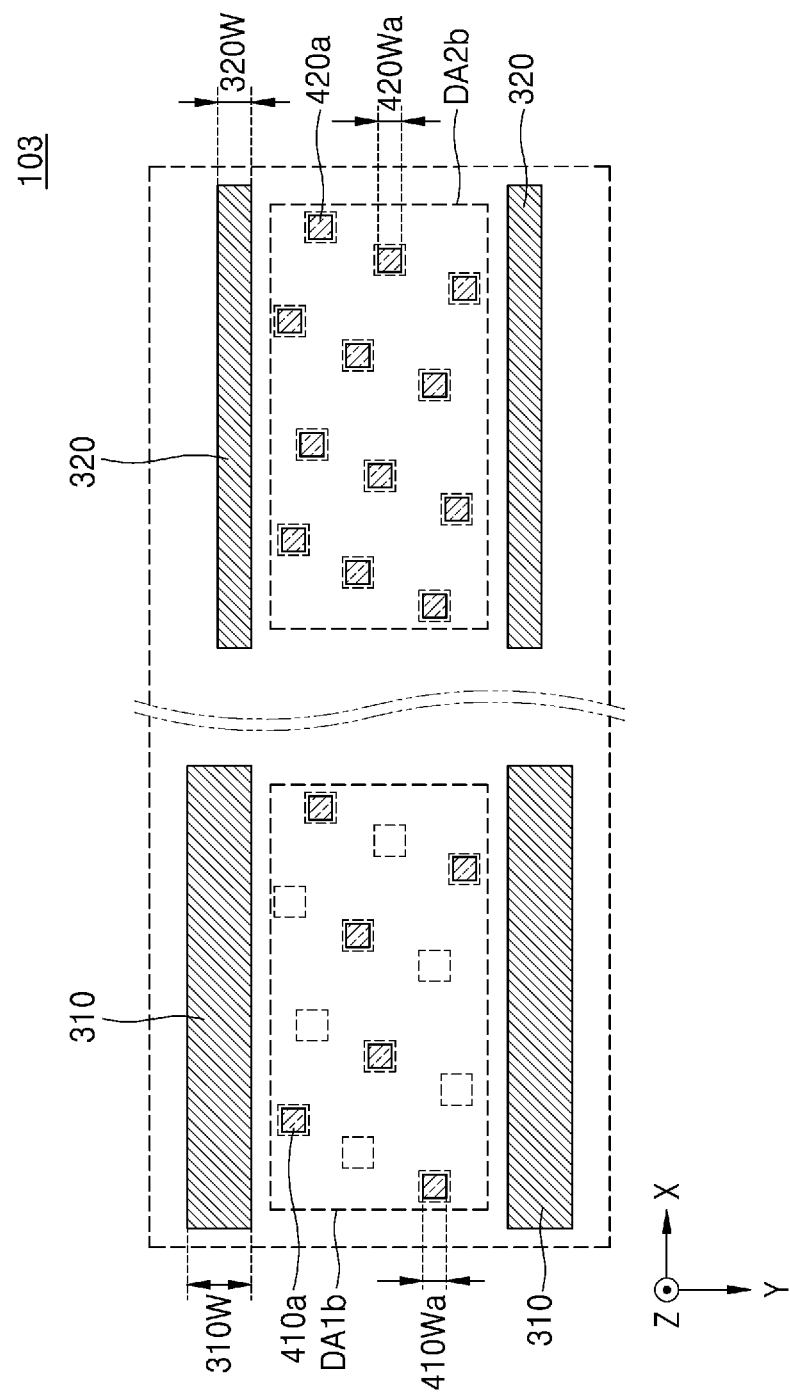
FIGS. 5 and 6 are plan views schematically illustrating an interconnection layer included in an interconnect structure of a semiconductor apparatus, respectively, according to example embodiments.
Figure 6:
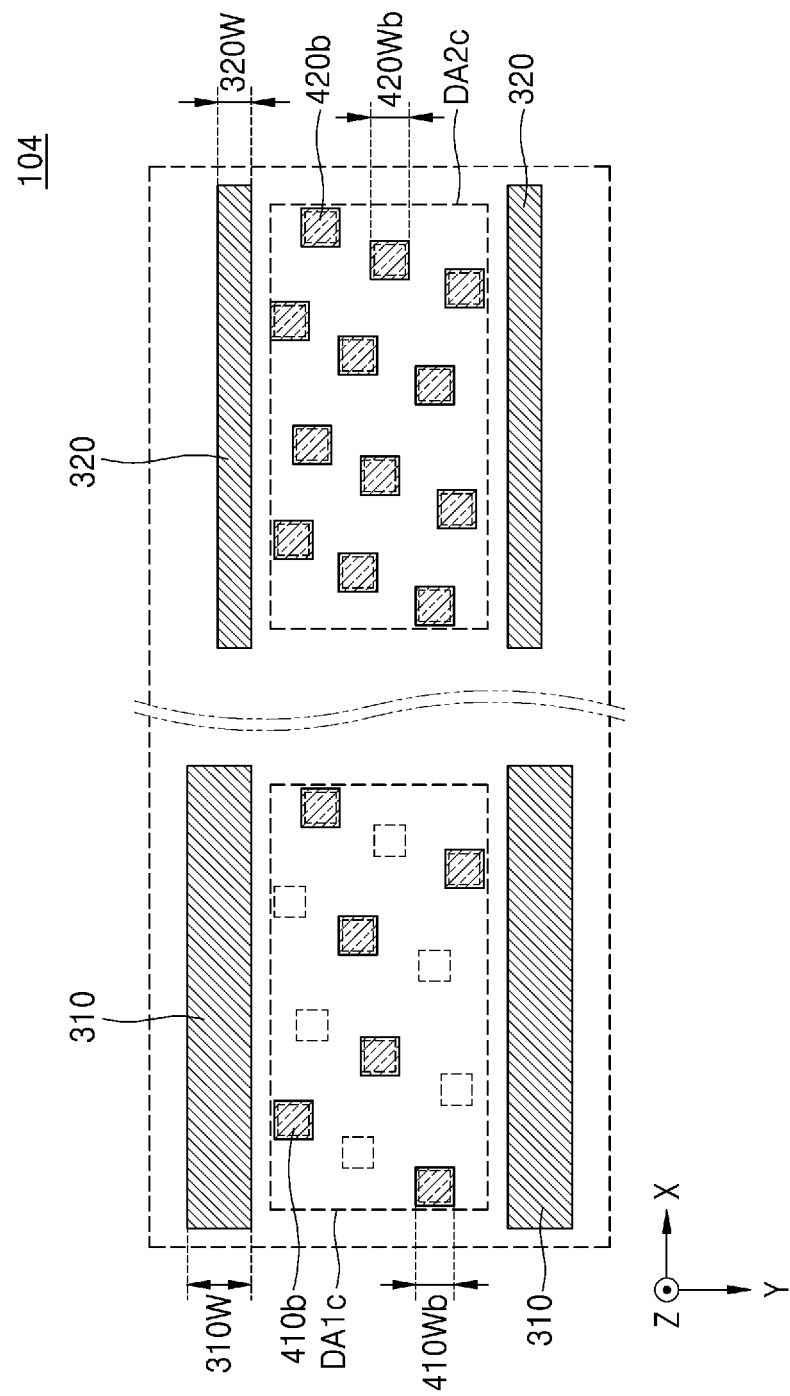

FIGS. 5 and 6 are plan views schematically illustrating an interconnection layer included in an interconnect structure of a semiconductor apparatus, respectively, according to example embodiments.

FIG. 5 shows one interconnection layer 103 among n interconnection layers (n is a natural number) included in a first interconnect structure. The interconnection layer 103 may include first main metal patterns 310 having a first line width 310W, first dummy metal patterns 410a having a first width 410Wa arranged in a first dummy insertion area DA1b defined by the first main metal patterns 310, second main metal patterns 320 having the second line width 320W that is less than the first line width 310W, and second dummy metal patterns 420a having second width 420Wa arranged in a second dummy insertion area DA2b defined by the second main metal patterns 320.

FIG. 6 shows one interconnection layer 104 among m interconnection layers (m is a natural number less than n) included in a second interconnect structure. The second interconnect structure of FIG. 6 may include a smaller number of interconnection layers than the first interconnect structure of FIG. 5. The interconnection layer 104 may include first main metal patterns 310 having the first line width 310W, third dummy metal patterns 410b having third width 410Wb arranged in a third dummy insertion area DA1c defined by the first main metal patterns 310, second main metal patterns 320 having the second line width 320W that is less than the first line width 310W, and fourth dummy metal patterns 420b having fourth width 420Wb arranged in a fourth dummy insertion area DA2c defined by the second main metal patterns 320.

A layout of the main metal patterns of the interconnection layer 103 of the first interconnect structure and a layout of the main metal patterns of the interconnection layer 104 of the second interconnect structure may be the same as the layout of the main metal patterns of the interconnection layer 102 of the interconnect structure of FIG. 4. Also, the first to fourth dummy insertion areas DA1b, DA2b, DA1c, and DA2c may have the same planar area.

Hereinafter, a method of determining a layout of dummy metal patterns based on the layout of the main metal patterns and the number of interconnection layers is described with reference to FIGS. 1, 2, 5, and 6.

In operation S130, the dummy pattern density in the interconnection layer may be adjusted according to the number of interconnection layers included in the interconnect structure. In example embodiments, assuming that the layout of the main metal patterns of the interconnection layer is constant, the dummy pattern density may decrease as the number of interconnection layers increases and increase as the number of interconnection layers decreases. For example, because the first interconnect structure of FIG. 5 includes a greater number of stacked interconnection layers than the second interconnect structure of FIG. 6, the dummy pattern density of the dummy metal patterns included in the interconnection layer 103 of the first interconnect structure of FIG. 5 may be less than the dummy pattern density of the dummy metal patterns included in the interconnection layer 104 of the second interconnect structure of FIG. 6.

When the layout of the main metal patterns of the interconnection layer is constant and the interconnect structure has a certain reference number of layers, the dummy pattern density may be set to have the second reference density. In this case, the dummy pattern density may increase with respect to the second reference density in proportion to a difference between the number of interconnection layers included in the interconnect structure and the reference number of layers.

In example embodiments, the local dummy pattern density of the dummy metal pattern in the dummy insertion area may be adjusted by increasing or decreasing the line width of the main metal pattern defining the corresponding dummy insertion area and increasing or decreasing the number of interconnection layers included in the interconnect structure.

When the interconnect structure has a certain reference number of layers and the line width of the main metal pattern defining the dummy insertion area has a certain reference line width, the local dummy pattern density of the dummy metal patterns in the corresponding dummy insertion area is set to be a third reference density. For example, the third reference density may be a value selected from 0.1 to 0.9. For example, the third reference density may be 0.5. For example, when the reference line width of the main metal pattern is 1 micrometer and the number of reference layers is determined to be 5, the third reference density may be 0.5. Hereinafter, for convenience of explanation, it is assumed that the first line width 310W of the first main metal pattern 310 is greater than the reference line width, and the second line width 320W of the second main metal pattern 320 is less than the reference line width. Further, it is assumed that the first interconnect structure includes more interconnection layers than the reference number of layers, and the second interconnect structure includes fewer interconnection layers than the reference number of layers.

In the interconnection layer 103 of the first interconnect structure of FIG. 5, the first line width 310W of the first main metal pattern 310 defining the first dummy insertion area DA1b is greater than the reference line width, and a greater number of interconnection layers than the reference number of layers is stacked in the first interconnect structure. In this case, the first dummy metal pattern 410a has a first local dummy pattern density corresponding to a first density value.

In addition, in the interconnection layer 103 of the first interconnect structure of FIG. 5, the second line width 320W of the second main metal pattern 320 defining the second dummy insertion area DA2b is less than the reference line width, and a greater number of interconnection layers than the reference number of layers is stacked in the first interconnect structure. In this case, the second local dummy pattern density of the second dummy metal pattern 420a may be adjusted to have a second density value greater than the first density value of the first local dummy pattern density. For example, when the first width 410Wa of the first dummy metal pattern 410a is equal to the second width 420Wa of the second dummy metal pattern 420a, the number of second dummy metal patterns 420a arranged in the second dummy insertion area DA2b may be adjusted to be greater than the number of first dummy metal patterns 410a arranged in the first dummy insertion area DA1b so that the second local dummy pattern density may be adjusted to be greater than the first local dummy pattern density.

In addition, in the interconnection layer 104 of the second interconnect structure of FIG. 6, the first line width 310W of the first main metal pattern 310 defining the third dummy insertion area DA1c is greater than the reference line width, and a smaller number of interconnection layers than the reference number of layers is stacked in the second interconnect structure. In this case, a third local dummy pattern density of the third dummy metal pattern 410b may be adjusted to have a third density value greater than the first density value. For example, when the number of first dummy metal patterns 410a arranged in the first dummy insertion area DA1b is equal to the number of third dummy metal patterns 410b arranged in the third dummy insertion area DA1c, the third width 410Wb of the third dummy metal pattern 410b may be adjusted to be greater than the first width 420Wa of the first dummy metal pattern 410a so that the third local dummy pattern density is greater than the first local dummy pattern density.

In addition, in the interconnection layer 104 of the second interconnect structure of FIG. 6, the second line width 320W of the second main metal pattern 320 defining the fourth dummy insertion area DA2c is less than the reference line width, and a smaller number of interconnection layers than the reference number of layers is stacked in the second interconnect structure. In this case, a fourth local dummy pattern density of the fourth dummy metal pattern 420b may be adjusted to have a fourth density value greater than the second density value and the third density value. For example, when the number of second dummy metal patterns 420a arranged in the second dummy insertion area DA2b is equal to the number of fourth dummy metal patterns 420b arranged in the fourth dummy insertion area DA2c, the fourth width 420Wb of the fourth dummy metal pattern 420b may be adjusted to be greater than the second width 420Wa of the second dummy metal pattern 420a so that the density of the fourth local dummy pattern may be adjusted to be greater than the second local dummy pattern density. Also, when the third width 410Wb of the third dummy metal pattern 410b is equal to the fourth width 420Wb of the fourth dummy metal pattern 420b, the number of the fourth dummy metal patterns 420b arranged in the fourth dummy insertion area DA2c may be adjusted to be greater than the number of the third dummy metal patterns 410b arranged in the third dummy insertion area DA1c so that the fourth local dummy pattern density may be adjusted to be greater than the third local dummy pattern density.

FIG. 7 is a schematic view illustrating a state in which a wafer 520 is attached to an interposer 510 in a manufacturing process of a semiconductor package according to example embodiments.

Referring to FIG. 7, in the process of manufacturing a semiconductor package using the interposer 510, an attachment process of attaching the wafer 520 onto the interposer 510 using an adhesive layer 530 may be performed. The interposer 510 may correspond to, for example, the semiconductor apparatus described above with reference to FIG. 1. The wafer 520 may include a semiconductor substrate on which a memory device, a logic device, an image sensor device, a micro electro mechanical systems (MEMS) device, and the like are formed. For example, the attachment process may be performed at high temperatures of about 100° C. to about 130° C.

When the attachment process is normally completed, a sidewall 521 of a device layer of the wafer 520 is covered by the adhesive layer 530. Because the sidewall 521 of the device layer of the wafer 520 is covered by the adhesive layer 530, damage such as chipping to the sidewall 521 of the device layer of the wafer 520 in a subsequent grinding process or sawing process, etc. may be prevented. However, if the interposer 510 is deformed to a certain level or more due to the stress acting on the interposer 510 while the attachment process is performed at high temperatures, the sidewall 521 of the device layer of the wafer 520 may not be covered by the adhesive layer 530 and may be exposed to the outside. In this case, the wafer 520 may be damaged by the grinding process or the sawing process subsequent to the attachment process, thereby degrading the reliability of the semiconductor package.

However, according to example embodiments, the interposer 510 may be manufactured after the layout of the dummy metal patterns and the layout of the interconnect structure so that warpage of the interposer 510 is controlled to an appropriate level in the manufacturing stage of the interposer 510. Because the semiconductor package may be manufactured using the interposer 510, costs for the manufacturing process of the semiconductor package may be reduced and the reliability of the semiconductor package formed using the interposer 510 may be improved.

While example embodiments have been particularly shown and described, it will be understood that various changes in form and details may be made therein without departing from the spirit and scope of the following claims.

What is claimed is:

1. A method of designing an interconnect structure of a semiconductor apparatus, the interconnect structure of the semiconductor apparatus including a plurality of interconnection layers sequentially stacked on a semiconductor substrate, and each of the plurality of interconnection layers including dummy metal patterns and main metal patterns, the method comprising:
    determining a layout of the main metal patterns included in each of the plurality of interconnection layers;
    determining a number of interconnection layers in the plurality of interconnection layers; and
    determining a layout of the dummy metal patterns included in each of the plurality of interconnection layers based on the determined layout of the main metal patterns and the determined number of interconnection layers,
    wherein the determining of the layout of the dummy metal patterns for a first interconnection layer of the plurality of interconnection layers comprises determining a first local dummy pattern density of first dummy metal patterns to be less than a second local dummy pattern density of second dummy metal patterns.

2. The method of claim 1, wherein the determining of the layout of the main metal patterns comprises determining, for each of the plurality of interconnection layers, a pattern density of the main metal patterns and a line width of each of the main metal patterns, and
    wherein the pattern density of the main metal patterns corresponds to a ratio of a planar area of the main metal patterns provided on a corresponding interconnection layer, to a planar area of the interconnect structure.

3. The method of claim 1, wherein the determining of the layout of the dummy metal patterns comprises determining, for each of the plurality of interconnection layers, a dummy pattern density of the dummy metal patterns, and
    wherein the dummy pattern density of the dummy metal patterns corresponds to a ratio of a planar area of the dummy metal patterns provided on a corresponding interconnection layer, to a planar area of the interconnect structure.

4. The method of claim 1, wherein the determining of the layout of the dummy metal patterns comprises:
    determining, for each of the plurality of interconnection layers, a number of dummy metal patterns;
    determining a width of each of the dummy metal patterns; and
    determining an average distance between the dummy metal patterns.

5. The method of claim 1, wherein a second interconnection layer of the plurality of interconnection layers comprises:
    first dummy metal patterns; and
    a first main metal pattern positioned near the first dummy metal patterns to define a first dummy insertion area in which the first dummy metal patterns are arranged, and having a first line width,
    wherein the determining of the layout of the dummy metal patterns comprises:
    identifying a local dummy pattern density of the first dummy metal patterns as less than a reference density based on the first line width of the first main metal pattern being greater than a reference line width; and
    identifying the local dummy pattern density of the first dummy metal patterns as greater than the reference density based on the first line width of the first main metal pattern being less than the reference line width, and
    wherein the local dummy pattern density corresponds to a ratio of a planar area of the first dummy metal patterns to a planar area of the first dummy insertion area.

6. The method of claim 1, wherein the first interconnection layer comprises:
    the first dummy metal patterns;
    the second dummy metal patterns;
    a first main metal pattern positioned near the first dummy metal patterns to define a first dummy insertion area in which the first dummy metal patterns are arranged, and having a first line width; and
    a second main metal pattern positioned near the second dummy metal patterns to define a second dummy insertion area in which the second dummy metal patterns are arranged, and having a second line width less than the first line width, and
    wherein the first local dummy pattern density corresponds to a ratio of a planar area of the first dummy metal patterns to a planar area of the first dummy insertion area, and the second local dummy pattern density corresponds to a ratio of a planar area of the second dummy metal patterns to a planar area of the second dummy insertion area.

7. The method of claim 6, wherein a number of first dummy metal patterns in the first dummy insertion area is less than a number of second dummy metal patterns in the second dummy insertion area.

8. The method of claim 6, wherein a width of the first dummy metal patterns in the first dummy insertion area is less than a width of the second dummy metal patterns in the second dummy insertion area.

9. The method of claim 1, wherein the determining of the layout of the dummy metal patterns comprises:
determining a dummy pattern density of the dummy metal patterns as less than a reference density based on the determined number of interconnection layers being greater than a reference number of layers; and
determining the dummy pattern density of the dummy metal patterns to be greater than the reference density based on the determined number of interconnection layers being less than the reference number of layers.

10. The method of claim 1, wherein each of the plurality of interconnection layers further comprises an insulating layer,
wherein the main metal patterns are electrically separated from the dummy metal patterns,
wherein the main metal patterns are provided at a same vertical level as the dummy metal patterns in each of the plurality of interconnection layers,
wherein the semiconductor substrate, a through-electrode penetrating through the semiconductor substrate, and the interconnect structure form an interposer, and
wherein the main metal patterns provided in each of the plurality of interconnection layers are electrically connected to the through-electrode.

11. The method of claim 1, further comprising generating the interconnect structure based on the determined number of interconnection layers, the determined layout of the main metal patterns included in each of the plurality of interconnection layers, and the determined layout of the dummy metal patterns included in each of the plurality of interconnection layers.

12. A method of designing an interconnect structure of a semiconductor apparatus, the interconnect structure of the semiconductor apparatus including a plurality of interconnection layers sequentially stacked on a semiconductor substrate, each of the plurality of interconnection layers including dummy metal patterns and main metal patterns, and the main metal patterns including a first main metal pattern positioned near the dummy metal patterns to define a dummy insertion area in which the dummy metal patterns are arranged, the method comprising:
determining a layout of the main metal patterns included in each of the plurality of interconnection layers;
determining a number of interconnection layers in the plurality of interconnection layers; and
determining a layout of the dummy metal patterns included in each of the plurality of interconnection layers based on the determined layout of the main metal patterns and the determined number of the plurality of interconnection layers,
wherein the determining of the layout of the dummy metal patterns comprises:
determining a local dummy pattern density of the dummy metal patterns as less than a first reference density based on a line width of the first main metal pattern having a first line width greater than a reference line width; and
determining the local dummy pattern density of the dummy metal patterns as greater than the first reference density based on the line width of the first main metal pattern having a second line width less than the reference line width,
wherein the local dummy pattern density corresponds to a ratio of a planar area of the dummy metal patterns provided on a corresponding interconnection layer, to a planar area of the dummy insertion area provided on the corresponding interconnection layer,
wherein the main metal patterns comprises:
a first main metal layer; and
a second main metal layer on a different vertical level as the first main metal layer,
wherein each of the first main metal layer and the second main metal layer comprises the first main metal pattern,
wherein the dummy metal patterns comprises:
a first dummy metal layer disposed on a same vertical level as the first main metal layer and being physically and electrically separated from the first main metal layer; and
a second dummy metal layer disposed on a same vertical level as the second main metal layer and being physically and electrically separated from the second main metal layer, and
wherein any of an electrical signal, voltage, and current is not applied to the first dummy metal layer and the second dummy metal layer.

13. The method of claim 12, wherein the determining of the layout of the dummy metal patterns comprises:
determining the local dummy pattern density of the dummy metal patterns as a first density value based on the line width of the first main metal pattern being greater than the reference line width and the number of interconnection layers being greater than a reference number of layers, and
determining the local dummy pattern density of the dummy metal patterns as a second density value greater than the first density value based on the line width of the first main metal pattern being greater than the reference line width and the number of interconnection layers being less than the reference number of layers.

14. The method of claim 13, wherein the determining of the layout of the dummy metal patterns comprises:
determining the local dummy pattern density of the dummy metal patterns as a third density value greater than the first density value based on the line width of the first main metal pattern being less than the reference line width and the number of interconnection layers being greater than the reference number of layers, and
determining the local dummy pattern density of the dummy metal patterns as a fourth density value greater than the second density value and the third density value based on the line width of the first main metal pattern being less than the reference line width and the number of interconnection layers being less than the reference number of layers.

15. The method of claim 12, wherein the determining of the layout of the dummy metal patterns comprises:
determining a number of dummy metal patterns;
determining a width of the dummy metal patterns; and
determining an average distance between the dummy metal patterns.

16. The method of claim 12, further comprising generating the interconnect structure based on the determined number of interconnection layers, the determined layout of the main metal patterns included in each of the plurality of interconnection layers, and the determined layout of the dummy metal patterns included in each of the plurality of interconnection layers.

17. A method of manufacturing a semiconductor apparatus including a semiconductor substrate and an interconnect structure on the semiconductor substrate, the interconnect structure including a plurality of interconnection layers sequentially stacked on the semiconductor substrate, and each of the plurality of interconnection layers including dummy metal patterns and main metal patterns, the method comprising:

determining a layout of the interconnect structure; and
forming the interconnect structure on the semiconductor substrate according to the determined layout of the interconnect structure,
wherein the determining of the layout of the interconnect structure comprises:
determining a layout of the main metal patterns included in each of the plurality of interconnection layers;
determining a number of interconnection layers in the plurality of interconnection layers; and
determining a layout of the dummy metal patterns included in each of the plurality of interconnection layers based on the determined layout of the main metal patterns and the determined number of the plurality of interconnection layers, and
wherein the determining of the layout of the dummy metal patterns for a first interconnection layer of the plurality of interconnection layers comprises determining a first local dummy pattern density of first dummy metal patterns to be less than a second local dummy pattern density of second dummy metal patterns.

18. The method of claim 17, wherein the determining of the layout of the main metal patterns comprises determining, for each of the plurality of interconnection layers, a pattern density of the main metal patterns,
wherein the determining of the layout of the dummy metal patterns comprises:
determining, for each of the plurality of interconnection layers, a dummy pattern density of the dummy metal patterns, and
determining, for each of the plurality of interconnection layers, the dummy pattern density of the dummy metal patterns such that a sum of the pattern density of the main metal patterns and the dummy pattern density of the dummy metal patterns is within a reference range, and
wherein the sum of the pattern density of the main metal patterns and the dummy pattern density of the dummy metal patterns is within about 20% to about 50%.

19. The method of claim 18, wherein the first interconnection layer includes:
the first dummy metal patterns;
the second dummy metal patterns;
a first main metal pattern positioned near the first dummy metal patterns to define a first dummy insertion area in which the first dummy metal patterns are arranged, and having a first line width; and
a second main metal pattern positioned near the second dummy metal patterns to define a second dummy insertion area in which the second dummy metal patterns are arranged, and having a second line width less than the first line width, and
wherein the first local dummy pattern density corresponds to a ratio of a planar area of the first dummy metal patterns to a planar area of the first dummy insertion area, and the second local dummy pattern density corresponds to a ratio of a planar area of the second dummy metal patterns to a planar area of the second dummy insertion area.

20. The method of claim 17, wherein the determining of the layout of the dummy metal patterns comprises:
determining a dummy pattern density of the dummy metal patterns to be less than a reference density based on the determined number of interconnection layers being greater than a reference number of layers; and
determining the dummy pattern density of the dummy metal patterns to be greater than the reference density based on the determined number of interconnection layers being less than the reference number of layers.

* * * * *